(12) United States Patent
Muronoi et al.

(10) Patent No.: US 11,153,974 B2
(45) Date of Patent: Oct. 19, 2021

(54) CONNECTOR DEVICE

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Yu Muronoi, Yokkaichi (JP); Naomichi Kawashima, Yokkaichi (JP); Masayuki Kato, Yokkaichi (JP); Takeo Uchino, Yokkaichi (JP); Akihiko Matsuoka, Yokkaichi (JP); Tatsuo Hirabayashi, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(*) Notice: Subject to any disclaimer, the term of this patent is extended or adjusted under 35 U.S.C. 154(b) by 14 days.

(21) Appl. No.: 16/818,071

(22) Filed: Mar. 13, 2020

(65) Prior Publication Data
US 2020/0315027 A1    Oct. 1, 2020

(30) Foreign Application Priority Data
Mar. 28, 2019  (JP) .............................. JP2019-063791

(51) Int. Cl.
| H05K 3/28 | (2006.01) |
| B29C 45/14 | (2006.01) |
| H05K 1/11 | (2006.01) |
| H05K 5/06 | (2006.01) |
| H05K 5/02 | (2006.01) |
| H05K 5/00 | (2006.01) |
| H01R 12/72 | (2011.01) |

(52) U.S. Cl.
CPC ............. *H05K 3/284* (2013.01); *B29C 45/14* (2013.01); *H01R 12/722* (2013.01); *H05K 1/11* (2013.01); *H05K 5/0034* (2013.01); *H05K 5/02* (2013.01); *H05K 5/064* (2013.01)

(58) Field of Classification Search
CPC ........ B29C 45/14; H01R 12/722; H05K 1/11; H05K 3/284; H05K 5/02; H05K 5/5064
See application file for complete search history.

(56) References Cited

U.S. PATENT DOCUMENTS

| 5,639,990 A | * | 6/1997 | Nishihara | ............. | H01L 23/043 |
| | | | | | 174/260 |
| 8,501,517 B1 | * | 8/2013 | Yow | ........................ | H01L 21/56 |
| | | | | | 438/51 |

FOREIGN PATENT DOCUMENTS

JP    2006-328993 A    12/2006

* cited by examiner

*Primary Examiner* — Carl J Arbes
(74) *Attorney, Agent, or Firm* — Oliff PLC

(57) ABSTRACT

A connector device that includes a circuit board; a connector attached to the circuit board; a plurality of collars for external attachment; a first molded resin that is made of a first resin material whose melting point or softening point is 230° C. or less, and covers the entire circuit board and part of the connector; and a second molded resin that is welded to the first molded resin, is made of a second resin material whose melting point or softening point is higher than that of the first resin material for the first molded resin, and covers outer circumferences of the collars.

8 Claims, 9 Drawing Sheets

CONNECTOR DEVICE

BACKGROUND

The present disclosure relates to a connector device.

Connectors whose terminals are provided within a resin housing are used to wire various electronic control parts to a control device, for example. There are also cases where a circuit board that constitutes a control device is disposed inside a cover of a machine part or the like on which various electronic control parts are provided, and a connector for wiring this circuit board to the electronic control parts or another control device is provided on the circuit board or the cover. A connector device is an integration of a circuit board disposed inside a resin cover or within a molded resin and a connector, and is used while being attached to a machine part or the like. The connector device may also be referred to as a substrate connector.

In some conventional connector devices, a circuit board is covered by two divided covers, and a waterproof sealing material is placed in the gap between the covers. Such connector devices of this cover type have a problem in that forming and assembling the covers and the sealing material take time, and the manufacturing process is complicated. The connector devices of this cover type also have a problem in that the covers have a large outer shape in order to cover the circuit board, leading to an increase in the size of the connector devices.

On the other hand, there are also molded-type connector devices in which a circuit board and part of a connector are disposed within a molded resin formed through molding, and the remaining part of the connector protrudes from the molded resin. In such a molded-type connector device, the waterproofing performance is ensured since the circuit board is covered with the molded resin, so that conventional covers and sealing material can be omitted. Furthermore, in the molded-type connector device, manufacturing processes such as forming and assembling are facilitated due to molding, and the connector device is downsized due to not using a cover. An example of the molded-type connector devices is disclosed, for example, in JP 2006-328993A.

SUMMARY

In molded-type connector devices, an attaching portion for attaching the connector device to an external device is required to be provided on a circuit board or a molded resin. If the attaching portion is provided on the circuit board, a large load will be applied to the circuit board, and it will be difficult to protect the circuit board.

For this reason, it is conceivable to provide the attaching portion on the molded resin. However, it is not possible to increase the molding temperature at which the molded resin for covering the circuit board and part of the connector is molded to a very high temperature, in order to protect a solder portion in the circuit board from heat. Accordingly, if an attaching portion such as a metal collar is provided on the molded resin, it will be difficult to maintain the rigidity of the attaching portion.

An exemplary aspect of the disclosure realizes a molded-type connector device that can have improved strength when it is attached to an external device.

According to one aspect of the present disclosure, a connector device includes: a circuit board; a connector attached to the circuit board; a plurality of collars for external attachment; a first molded resin that is made of a first resin material whose melting point or softening point is 230° C. or less, and covers the entire circuit board and part of the connector; and a second molded resin that is welded to the first molded resin, is made of a second resin material whose melting point or softening point is higher than that of the first resin material for the first molded resin, and covers outer circumferences of the collars.

According to the connector device of the one aspect, it is possible to realize a molded-type connector device that can have improved strength when it is attached to an external device.

DETAILED DESCRIPTION OF EMBODIMENTS

Figure 1:
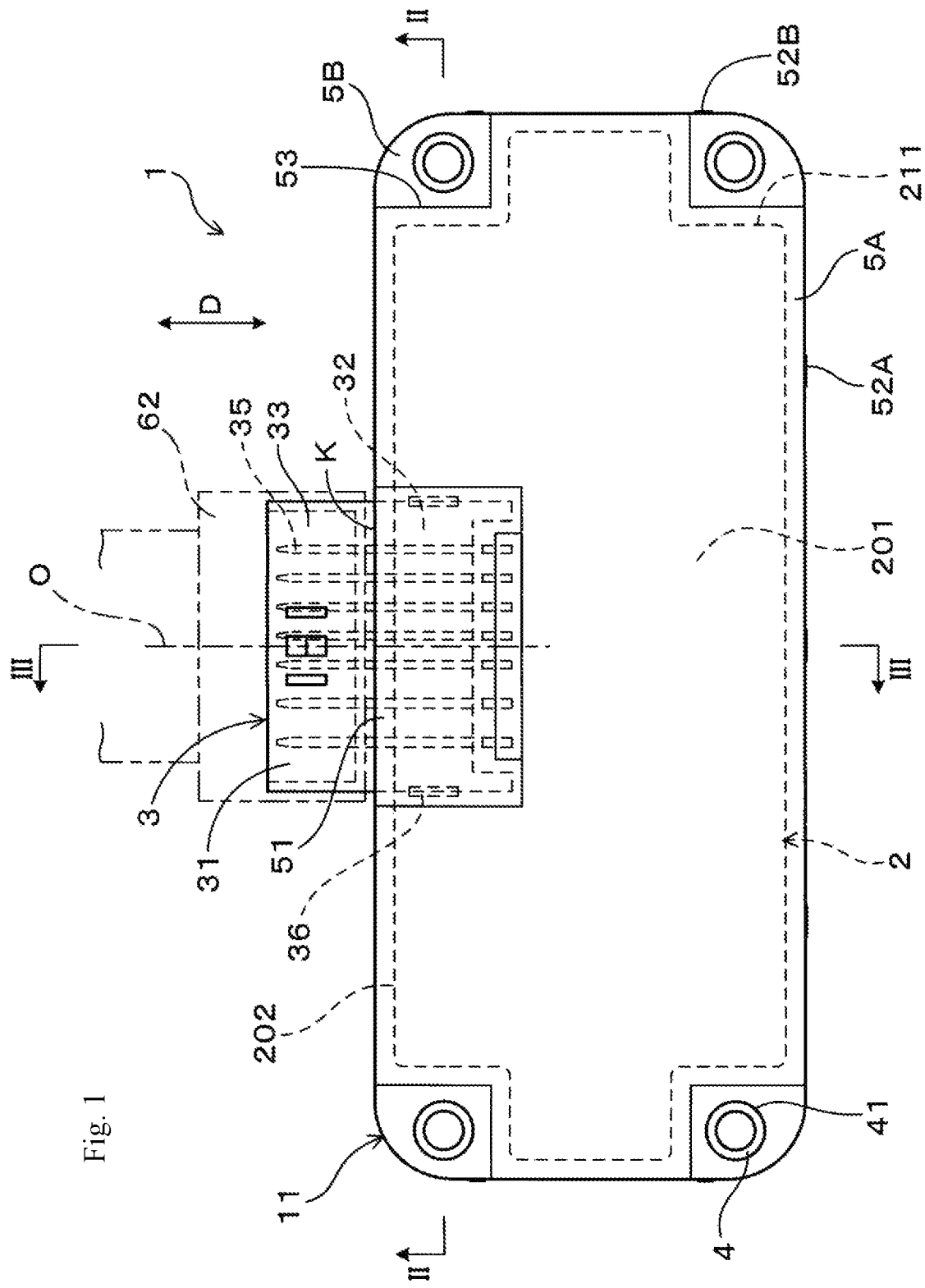
FIG. 1 is a plan view illustrating a connector device according to an embodiment.

Description of Embodiments of the Present Disclosure

First, embodiments of the present disclosure will be described in series.

(1) According to one aspect of the present disclosure, a connector device includes:

a circuit board;

a connector attached to the circuit board;

a plurality of collars for external attachment;

a first molded resin that is made of a resin material whose melting point or softening point is 230° C. or less, and covers the entire circuit board and part of the connector; and a second molded resin that is welded to the first molded resin, is made of a resin material whose melting point or softening point is higher than that of the resin material for the first molded resin, and covers outer circumferences of the collars.

Functional Effects

The connector device of the one aspect is of a molded-type in which the entire circuit board and part of the connector are covered with the first molded resin. Also, in this connector device, two type of materials, namely, the first molded resin and the second molded resin constitute a molded resin, and the second molded resin made of a resin material whose melting point or softening point is higher than that of the first molded resin covers the outer circumferences of the metal collars.

The collars and the second molded resin constitute an attaching portion for attaching the connector device to an external device. The connector device is attached to an external machine part or the like, using bolts inserted into the respective collars.

The first molded resin covers the entire circuit board, so that the entire circuit board is protected from water by the first molded resin. The first molded resin also covers part of the connector, and the remaining part of the connector to which a counterpart connector is to be mounted is not covered with the first molded resin.

The first molded resin and the second molded resin are formed through molding. Examples of the molding include melt molding such as hot melt molding, as well as injection molding. When molding is performed, a conductive material such as solder that connects a conductor portion of the circuit board and terminals of the connector should be prevented from melting. In order to prevent the conductive material from melting, the melting point or softening point of the first molded resin is set to 230° C. or less.

On the other hand, the second molded resin does not come into contact with the circuit board and the connector, and thus does not play a role in preventing the conductive material from melting. Accordingly, a resin material whose melting point or softening point is high can be used for the second molded resin, and since the second molded resin can have a high melting point or softening point, it is easy to select a resin material having a high rigidity (mechanical strength) for the second molded resin.

Specifically, if a crystalline thermoplastic resin is used for the second molded resin, the thickness of a crystalline layer tends to be larger the higher the melting point is. Accordingly, a resin material whose melting point is high can be selected for the second molded resin that has no limitation with respect to the melting point, according to the required rigidity.

The outer circumferences of the plurality of collars are covered by the second molded resin, and the ends of the plurality of collars are exposed. The connector device is attached to an external machine part or the like, using bolts inserted into the respective inner circumferential holes of the plurality of collars.

The collars are integrated with the second molded resin, so that the rigidity in the vicinity of the collars can be increased. Accordingly, when the connector device is attached to an external machine part or the like, the connector device can be made less likely to vibrate, making it possible to increase the strength of a molded-type connector device when it is attached to an external device.

(2) The plurality of collars may be respectively arranged in notch portions formed in the circuit board, an end of the first molded resin may be arranged along an edge face of the circuit board that includes edge faces of the notch portions, and the second molded resin may be arranged in the notch portions, and may be welded to the end of the first molded resin while covering the outer circumferences of the collars. With this configuration, it is possible to prevent the portions in which the collars are arranged from protruding from the connector device as much as possible, and to downsize the connector device.

(3) The circuit board may have a shape such that the notch portions are located at four corners of a rectangular plate, and the rectangular plate may be constituted by the entirety of the first molded resin and the second molded resin. With this configuration, it is possible to prevent the formation of any protrusion other than the connector in the connector device as much as possible, and to downsize the connector device.

(4) The first molded resin may be made of a polyamide resin, and the second molded resin may be made of a polyamide resin whose melting point or softening point is higher than that of the polyamide resin of which the first molded resin is made. With this configuration, the first molded resin and the second molded resin can be made of the same type of resin material, and the strength of welding between the first molded resin and the second molded resin can further be increased.

(5) The first molded resin may be made of a polyester resin, and the second molded resin may be made of a polyester resin whose melting point or softening point is higher than that of the polyester resin of which the first molded resin is made. With this configuration, the first molded resin and the second molded resin can be made of the same type of resin material, and the strength of welding between the first molded resin and the second molded resin can further be increased.

(6) The second molded resin may be made of a resin material that contains glass fibers. With this configuration, it is possible to easily increase the rigidity of the second molded resin relative to the rigidity of the first molded resin.

Melting Point or Softening Point of First Molded Resin and Second Molded Resin

The first molded resin can be made of a resin material whose melting point or softening point is 150° C. or more and 200° C. or less. The second molded resin can be made of a resin material whose melting point or softening point is 200° C. or more and 320° C. or less. Furthermore, the resin material of which the second molded resin is made may preferably have a melting point or softening point of 220° C. or more.

A first molded resin having a melting point or softening point of 150° C. or more can improve the heat resistance of the molded resin. Also, a first molded resin having a melting point or softening point of 230° C. or less is preferable in terms of not affecting the conductive material that connects the conductor of the circuit board and the terminals of the connector when the molded resin is formed. Furthermore, a first molded resin having a melting point or softening point of 200° C. or less can protect the conductive material and facilitate formation of the molded resin.

A second molded resin having a melting point or softening point of 200° C. or more can improve the rigidity of the second molded resin, and can effectively improve the strength of the connector device when being attached. To further improve the rigidity of the second molded resin, a resin material whose melting point or softening point is 220° C. or more is preferably used for the second molded resin. On the other hand, a second molded resin having a melting point or softening point of 320° C. or less can maintain a low molding temperature at which the second molded resin is molded, making it possible to maintain a high productivity of the connector device.

Polyamide Resin

Polyamide resin is a thermoplastic resin, and is a linear polymer molecule (polymer) whose main chain is formed by repeated amide bonds (—CONH—). Particularly, aliphatic polyamide is generally referred to as nylon. In polyamide resin, a hydrogen bond is formed between H (hydrogen) of an amide bond in a molecular chain and O (oxygen) of an amide bond in another molecular chain. The hydrogen bond plays a role in strongly bonding molecular chains of the polyamide resin together.

For example, a polyamide resin whose melting point or softening point is 150° C. or more and 200° C. or less may be used for the first molded resin. The critical significance in this case is the same as that of the description about the first molded resin.

For example, a polyamide resin whose melting point or softening point is 220° C. or more and 320° C. or less may be used for the second molded resin. The critical significance in this case is the same as that of the description about the second molded resin. Note that, in this case, the lower limit of the melting point or softening point is 220° C., instead of 200° C.

Typical polyamide resin is highly crystalline, and crystalline polyamide resin has a melting point of higher than 230° C. In the connector device according to the one aspect, a polyamide resin whose melting point is low is used by design. The thickness of a crystalline layer of the polyamide resin and the melting point are correlated. By reducing the thickness of the crystalline layer of the polyamide resin, the melting point of the polyamide resin can be reduced. Furthermore, if, for example, a polyamide resin made of dimer acid is used, the polyamide resin will not have a substantially crystalline structure. In this case, the softening point of the polyamide resin can be reduced by using various methods.

Polyester Resin

Polyester resin is a linear polymer molecule (polymer) whose main chain is formed by repeated ester bonds (—CO—O—). Polyester resin may be a thermoplastic resin such as polyethylene terephthalate (PET) or alkyd resin, and may also be a thermosetting unsaturated polyester or the like.

For example, a polyester resin whose melting point or softening point is 150° C. or more and 200° C. or less may be used for the first molded resin. The critical significance in this case is the same as that of the description about the first molded resin.

For example, a polyester resin whose melting point or softening point is 220° C. or more and 280° C. or less may be used for the second molded resin. The critical significance in this case is the same as that of the description about the second molded resin. Note that, in this case, the lower limit of the melting point or softening point is 220° C., instead of 200° C., and the upper limit of the melting point or softening point is 280° C., instead of 320° C.

Furthermore, the melting point or softening point of the second molded resin is preferably higher than that of the first molded resin by 20° C. or more. Due to the difference in the melting point or softening point, it is easy to achieve both protection of the circuit board when the first molded resin is formed, and improvement of the strength of the connector device using the second molded resin when the connector device is attached. Note that it is more preferable that the melting point or softening point of the second molded resin be higher than that of the first molded resin by 30° C. or more.

Examples of the materials for the first molded resin and the second molded resin include a polyamide resin such as PA66, PA6, PA46, PA610, PA612, PA6T, PAMXD6, PA4T, or PA9T, a polyester resin such as polybutylene terephthalate (PBT) or PET, or poly phenylene sulpide (PPS), and syncliotactic polystyrene (SPS).

(7) The first molded resin and the second molded resin may have gate marks that respectively indicate that the first molded resin and the second molded resin are formed through molding. With this configuration, it is possible to confirm that the first molded resin and the second molded resin of the connector device are formed through molding.

(8) A region of the first molded resin that faces a plate of the circuit board may have a thickness in a range from 1 mm to 5 mm inclusive. With this configuration, it is possible to reduce the thickness of the first molded resin while maintaining the strength of the first molded resin.

(9) The connector device may be used as an on-board control unit. The on-board control unit is also referred to as an electronic control unit. The connector device, when installed in a vehicle and is used, is protected from water when the vehicle is exposed to water.

(10) The first molded resin may serve as the outer-most cover that is exposed to air. With this configuration, it is possible to downsize the connector device. Furthermore, water contained in the air can be prevented from entering the interface between the housing of the connector and the first molded resin.

Details of Embodiments of the Present Disclosure

An embodiment of the connector device of the present disclosure will be described with reference to the drawings.

Embodiment

Figure 2:
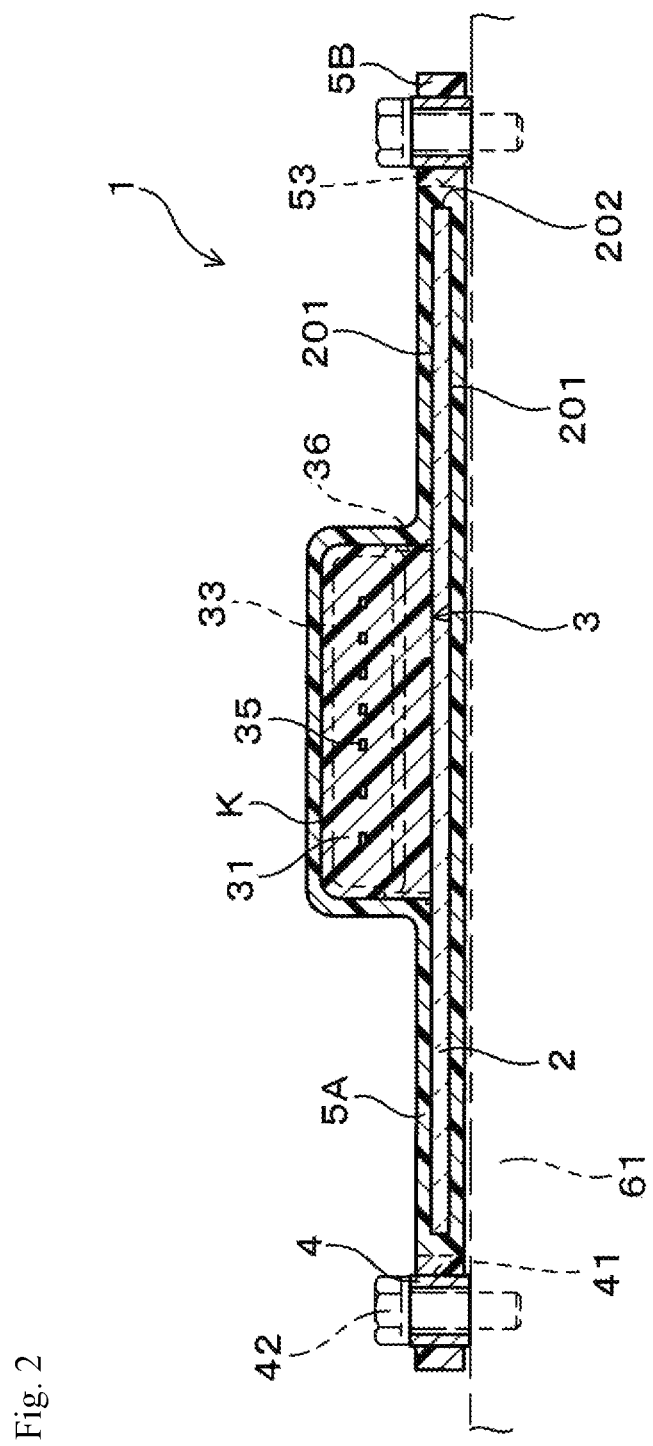
FIG. 2 is a cross-sectional view taken along a line II-II in FIG. 1, illustrating the connector device according to the embodiment.
Figure 3:
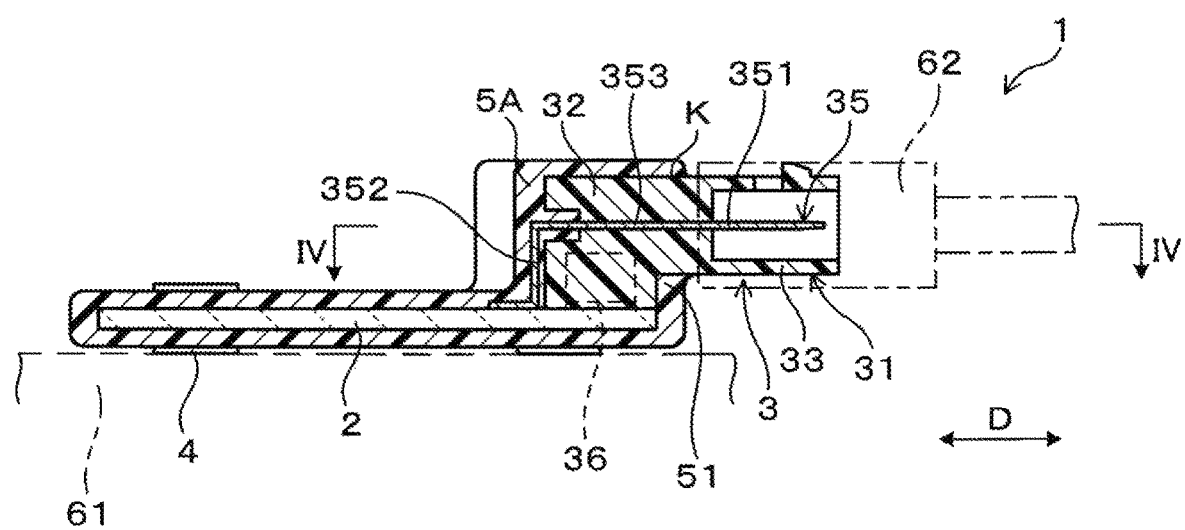
FIG. 3 is a cross-sectional view taken along a line III-III in FIG. 1, illustrating the connector device according to the embodiment.

As shown in FIGS. 1 to 3, a connector device 1 according to the present embodiment is provided with a circuit board 2, a connector 3, a plurality of collars 4 for external attachment, a first molded resin 5A, and a second molded resin 5B. The connector 3 is attached to the circuit board 2. The plurality of collars 4 for external attachment constitute an attaching portion 11 of the connector device 1, and outer circumferences 41 of the collars 4 face an edge face 202 of the circuit board 2. The first molded resin 5A is made of a resin material whose melting point or softening point is 230° C. or less. The first molded resin 5A covers the entire circuit board 2 and part of the connector 3. The second molded resin 5B is welded to the first molded resin 5A, and is made of a resin material whose melting point or softening point is higher than that of the first molded resin 5A. The second molded resin 5B covers the outer circumferences 41 of the collars 4.

The following will describe the connector device 1 of the present embodiment in detail.

Connector Device 1

As shown in FIGS. 1 to 3, the connector device 1, serving as an on-board control unit, is used as a control device for a machine part 61 installed in a vehicle. The connector device 1 is used while being attached to the machine part 61 or the like. The circuit board 2 of the connector device 1 is configured to control various types of electronic control parts of the machine part 61. Examples of the electronic control parts include various types of actuators and sensors.

The connector device 1 can be used as, for example, a module of an electrical braking system such as an Electro Mechanical Brake (EMB) or an Electronic Parking Brake (EPB), or a control unit such as a Fuel Injection Engine Control Unit (FI-ECU).

The connector device 1 of the present embodiment is of a molded-type in which the circuit board 2 is covered with the first molded resin 5A made of a thermoplastic resin. Also, the connector device 1 does not include a cover (case) made of a resin or the like that houses the circuit board 2, and a waterproof sealing material. The first molded resin 5A that covers entire circuit board 2 and part of the housing 31 of the connector 3 serves as an outermost cover that is exposed to air. The first molded resin 5A is provided in place of a cover and a sealing material, and protects the circuit board 2 and terminals 35 of the connector 3 from water contained in the air. As a result of using the first molded resin 5A in place of a cover and a sealing material, it is possible to downsize the connector device 1.

Circuit Board 2

Figure 4:
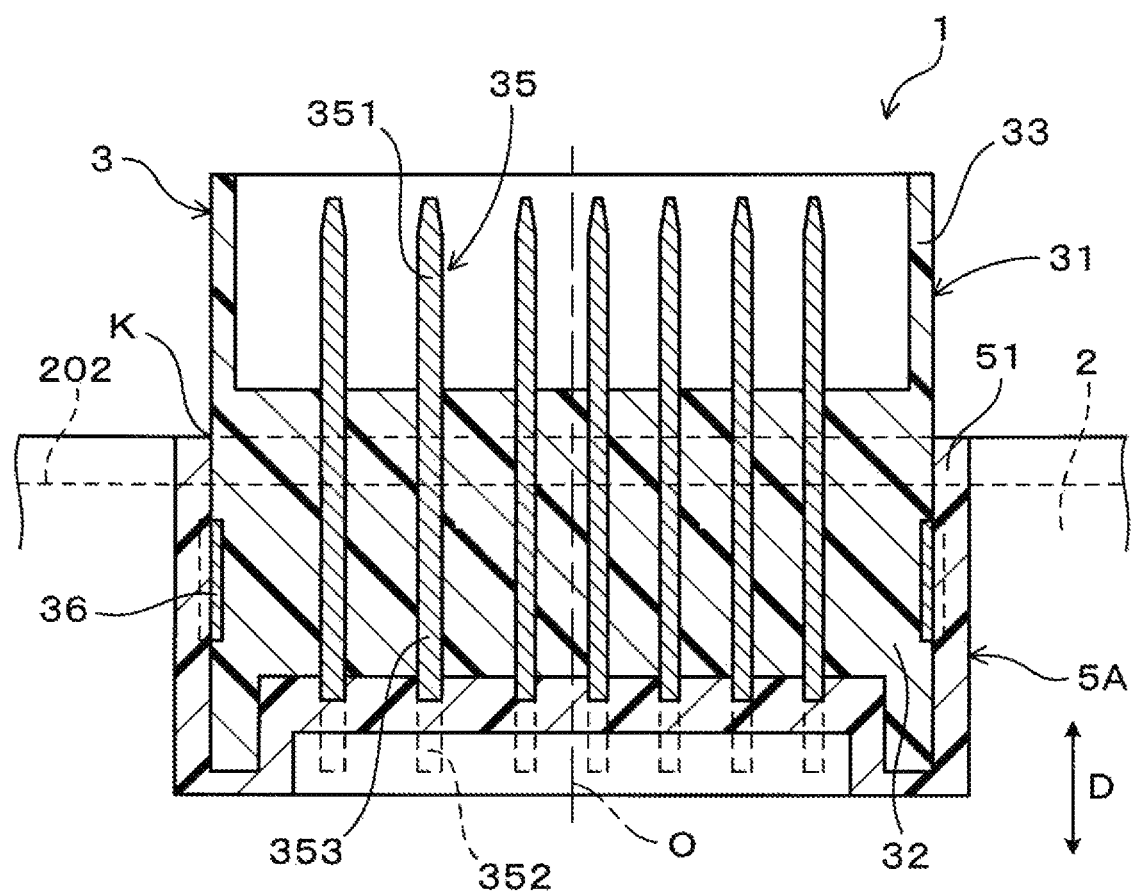
FIG. 4 is an enlarged view of a cross section taken along a line IV-IV in FIG. 3 according to the embodiment.
Figure 5:
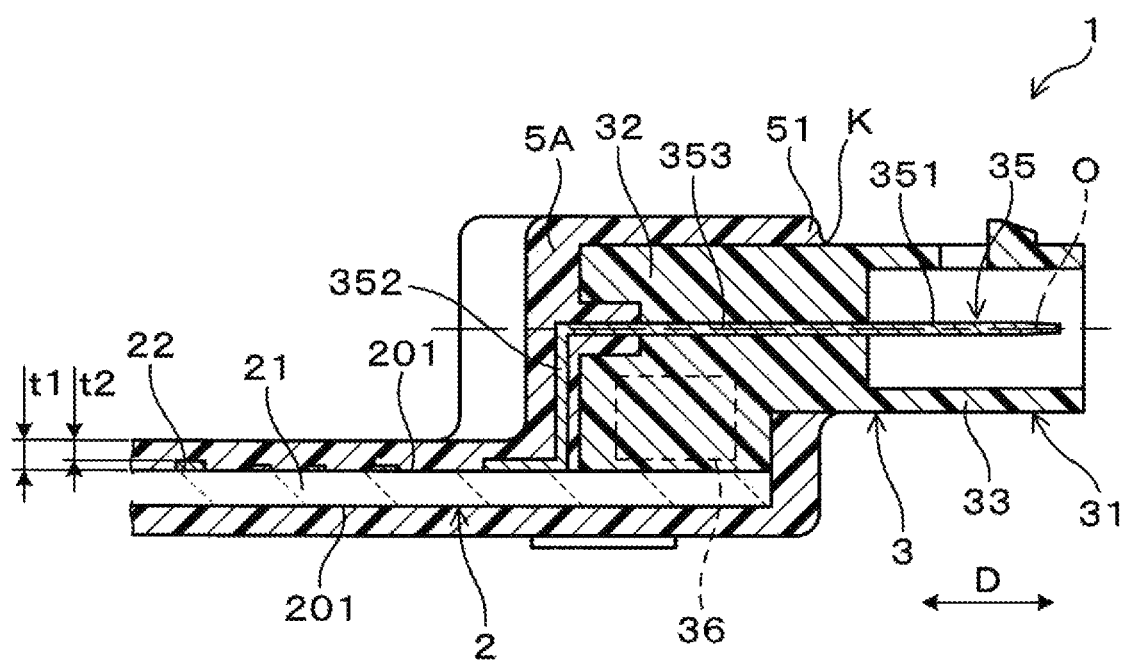
FIG. 5 is a partially enlarged cross-sectional view of FIG. 3 according to the embodiment.

As shown in FIGS. 3 to 5, the circuit board 2 includes a planar substrate portion 21 made of an insulating base material such as glass or resin on which a conductor carrying electricity is formed, and electric components 22 such as a semiconductor, a resistor, a capacitor, a coil, and a switch that are provided on the substrate portion 21 so as to be electrically connected to the conductor of the substrate portion 21. It is assumed that the electric components 22 also include an electronic component made of a semiconductor or the like. The connector 3 is attached to the vicinity of one side of the planar substrate portion 21, which includes rectangular plates 201. Here, the plates 201 refer to a pair of surfaces of the planar circuit board 2 that have the largest area. Furthermore, the rectangular plates encompass plates with chamfered corners, plates with curved surfaces, and the like.

As shown in FIG. 1, the substrate portion 21 of the circuit board 2 is formed in the shape of a rectangular plate having notch portions 211 (notches) at four corners thereof. The notch portions 211 are formed for the collars 4 and the second molded resin 5B to be arranged therein. The notch portions 211 have a rectangular shape cut off at the four corners of the substrate portion 21. The notch portions 211 may also have a triangular shape cut out at the four corners of the substrate portion 21. The entire circuit board 2 is embedded in the first molded resin 5A.

Figure 6:
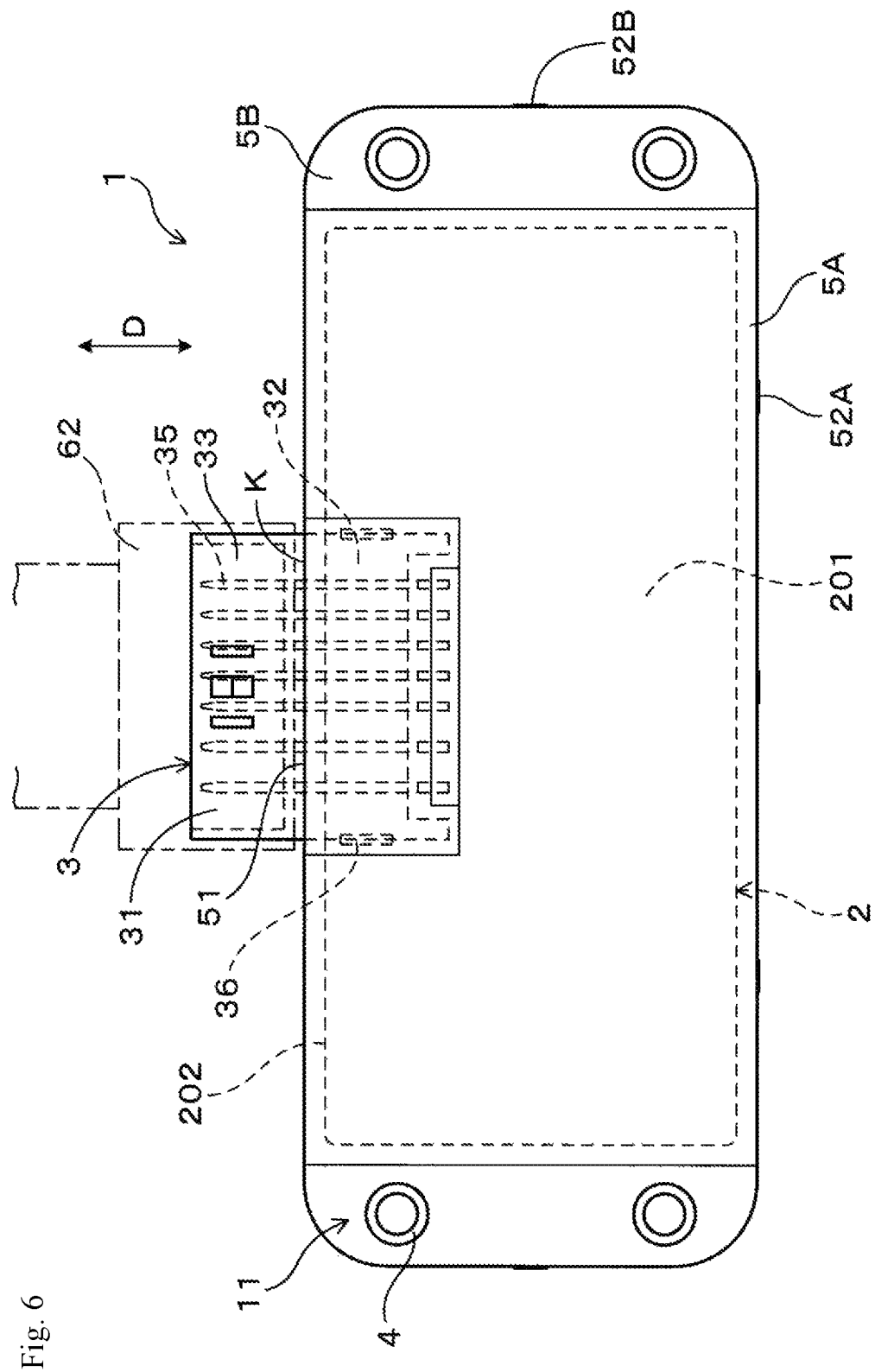
FIG. 6 is a plan view illustrating another connector device according to the embodiment.

As shown in FIG. 6, the substrate portion 21 of the circuit board 2 may also have a rectangular plate shape. In this case, the collars 4 can be arranged lateral to the substrate portion 21 with the outer circumferences thereof facing the edge face (side face) 202 of the rectangular substrate portion 21. In this case, the second molded resin 5B is welded to sides of the first molded resin 5A while enclosing the outer circumferences 41 of the collars 4.

Connector 3

As shown in FIGS. 1 to 3, the connector 3 includes the insulating housing 31 made of a thermoplastic resin, and the plurality of terminals 35 that are held by the housing 31 and are made of a conductive metal material. Examples of the plurality of terminals 35 include a control terminal for use in transmission of a control signal, and a power supply terminal to be connected to a DC power supply, a ground, or the like. The connector 3 of the present embodiment is arranged in a planar direction parallel to the plates 201 of the circuit board 2.

The plurality of terminals 35 respectively have leading end portions 351 that are arranged in the planar direction of the circuit board 2. Furthermore, the plurality of terminals 35 respectively have base portions (base end portions) 352 that are connected to the conductor of the substrate portion 21 and are arranged while being bent from the state of being parallel to the planar direction of the substrate portion 21 to the state of being perpendicular to the planar direction of the substrate portion 21.

In other words, as shown in FIGS. 4 and 5, the plurality of terminals 35 are bent in a crank shape so as to take the state of being parallel to the planar direction of the substrate portion 21, the state of being perpendicular to the planar direction, and the state of being parallel to the planar direction. The housing 31 of the connector 3 includes a holding portion 32 that holds intermediate portions 353 of the plurality of terminals 35, and a hood portion (mounting portion) 33 that is tubular and encloses the leading end portions 351 of the plurality of terminals 35 and to which the counterpart connector 62 is to be mounted.

Most of the holding portion 32 of the housing 31 faces the circuit board 2, and is covered, together with the circuit board 2, with the first molded resin 5A. The hood portion 33 of the housing 31 protrudes from an edge face 202 of the circuit board 2, and is not covered with the first molded resin 5A. An end of an interface K between the housing 31 and the first molded resin 5A, that is to say, a leading end portion 51 of the first molded resin 5A is located in the holding portion 32 of the housing 31. The connector 3 constitutes a male connector, and the plurality of terminals 35 of the connector 3 constitute male terminals. The leading end portions 351 of the plurality of terminals 35 that protrude from the holding portion 32 of the hood portion 33 are to be electrically connected to female terminals of the counterpart connector 62 serving as a female connector.

As shown in FIGS. 4 and 5, the base portions 352 of the plurality of terminals 35 protrude from the holding portion 32 of the housing 31, and are connected, through soldering, to the conductor of the substrate portion 21 of the circuit board 2. The holding portion 32 of the housing 31 includes, in addition to the plurality of terminals 35, pegs (metal parts) 36 for fixing the housing 31 to the circuit board 2. Parts of the pegs 36 are connected, through soldering, to the conductor of the substrate portion 21 of the circuit board 2. Thus, the housing 31 is fixed to the circuit board 2 by the base portions 352 of the plurality of terminals 35 and the parts of the pegs 36.

The base portions 352 of the plurality of terminals 35 are arranged outside of the holding portion 32, and are covered with the first molded resin 5A. Also, parts of the pegs 36 are arranged outside of the holding portion 32, and are covered with the first molded resin 5A.

The housing 31 is made of a liquid crystal polymer. More specifically, the housing 31 is formed by performing insert molding of inserting a resin material for a liquid crystal polymer into a mold die in which the plurality of terminals 35 and the plurality of pegs 36 are arranged. In the housing 31, the end portions 351 and 352 of the plurality of terminals 35, and parts of the pegs 36 are exposed. Note that the housing 31 may also be made of a poly phenylene sulfide resin.

The connector 3 may also be arranged in a direction perpendicular to the planar direction of the plates 201 of the circuit board 2. In this case, the leading end portions 351 of the plurality of terminals 35 are arranged in a direction perpendicular to the planar direction of the circuit board 2.

First Molded Resin 5A

As shown in FIGS. 1 to 3, the first molded resin 5A is formed through molding such that the circuit board 2 and the connector 3 are arranged in the mold die, the mold die is filled with a melted resin material for forming the first molded resin 5A, and the resin material is solidified. This molding method is also referred to as hot melt molding, and is a molding method in which a melted resin material is poured into a mold die at low pressure to form the first molded resin 5A in the mold die. As a result of hot melt molding, it is possible to form the first molded resin 5A at low temperature and low pressure, and thus no adverse effects due to the temperature and the pressure occur in the electric components 22 attached to the circuit board 2, serving as an insert component.

As shown in FIG. 1, the first molded resin 5A can be formed through molding at low pressure and low temperature, and thus the formation is easy. The first molded resin 5A has a gate mark 52A that indicates that it is formed through molding. The gate mark 52A is formed at an end of the first molded resin 5A that is located on the edge face 202 of the circuit board 2.

The gate mark 52A is a mark obtained when the resin material remains in a gate, which is formed in the mold die and is an entrance for the resin material, and the remaining resin material is cut from the first molded resin 5A serving as a product. As a result of the first molded resin 5A having the gate mark 52A, it is possible to confirm that the first molded resin 5A is formed by molding.

As shown in FIG. 5, the first molded resin 5A covers the entire circuit board 2 including the electric components 22, and the holding portion 32 of the housing 31 of the connector 3, the base portions 352 of the plurality of terminals 35, and parts of the pegs 36. The first molded resin 5A has a thickness as uniform as possible over the plates 201 of the circuit board 2 and the surface of the holding portion 32 of the housing 31 of the connector 3. The region of the first molded resin 5A that faces the plates 201 of the circuit board 2 has thicknesses t1 and t2 in a range from 1 mm to 5 mm inclusive. If the thicknesses t1 and t2 of the first molded resin 5A are less than 1 mm, the first molded resin 5A will not have sufficient strength, and if the thicknesses t1 and t2 of the first molded resin 5A exceed 5 mm, an excessive amount of the resin material will be consumed.

As shown in FIG. 5, a plate 201 of the substrate portion 21 of the circuit board 2 has a convex region in which the electric components 22 are arranged. The surface of the first molded resin 5A that is arranged on the plate 201 of the substrate portion 21 of the circuit board 2 may be flat. In this case, the thickness t2 of the first molded resin 5A in the region of the substrate portion 21 in which an electric component 22 is arranged is less than the thickness t1 of the first molded resin 5A in the region of the substrate portion 21 in which no electric component 22 is arranged.

Figure 7:
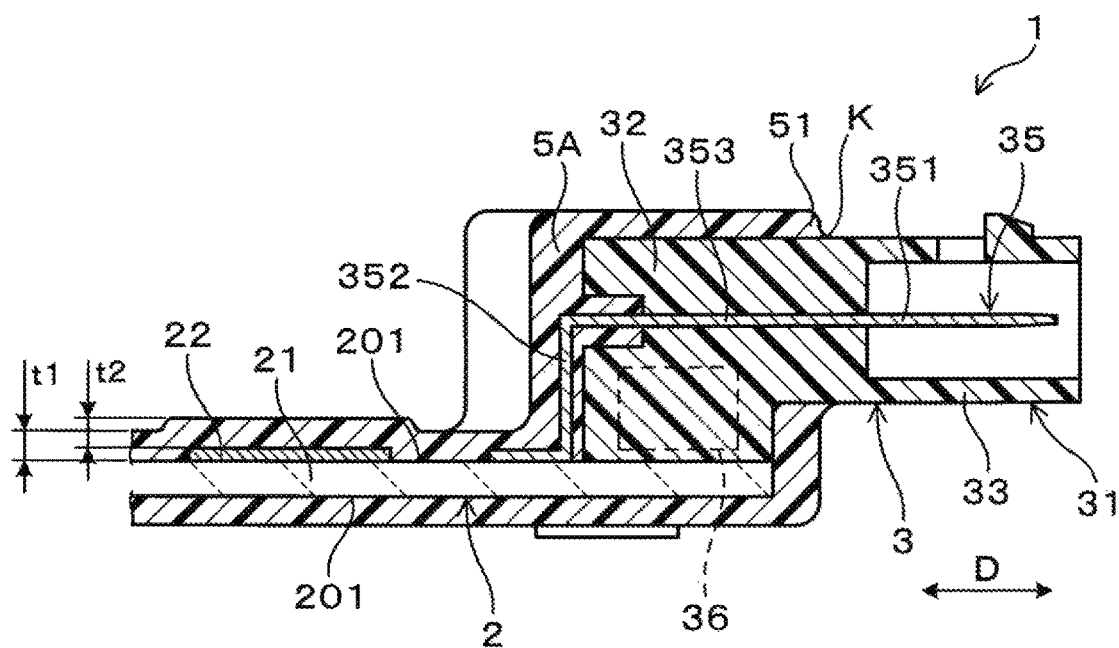
FIG. 7 is a cross-sectional view of the other connector device according to the embodiment, the cross-sectional view corresponding to FIG. 5.

Also, as shown in FIG. 7, the thickness t2 of a first molded resin 5A in the region of the substrate portion 21 in which an electric component 22 is arranged may also be set to be equal to the thickness t1 of the first molded resin 5A in the region of the substrate portion 21 in which no electric component 22 is arranged. In this case, the first molded resin 5A in the region of the substrate portion 21 in which the electric component 22 is arranged will protrude in a convex shape from the first molded resin 5A in the region of the substrate portion 21 in which no electric component 22 is arranged.

As shown in FIGS. 4 and 5, if it is assumed that the direction in which the leading end portions 351 of the plurality of terminals 35 extend and the hood portion 33 is formed is set to a mounting direction D in which the counterpart connector 62 is to be mounted, the first molded resin 5A will be provided over the entire periphery of the holding portion 32 of the housing 31 of the connector 3 around the central axis line O of the hood portion 33 and the holding portion 32, the central axis line O extending in the mounting direction D. Here, "central axis line O" refers to a virtual line that extends through the centers of the cross sections of the hood portion 33 and the holding portion 32 that are orthogonal to the mounting direction D. The thickness of the first molded resin 5A in the region that faces the surface of the housing 31 of the connector 3 is in the range from 1 mm to 5 mm inclusive.

The first molded resin 5A covers the plates 201 on both sides and the edge face 202 of the substrate portion 21 of the circuit board 2, and edge faces 203 of the notch portions 211. Furthermore, the end of the first molded resin 5A is arranged along the edge face 202 of the circuit board 2 including the edge faces 203 of the notch portions 211 of the circuit board 2. In other words, the end of the first molded resin 5A is arranged on the edge face 202 of the substrate portion 21 of the circuit board 2, the edge faces 203 of the notch portions 211, and the surface of the holding portion 32 of the housing 31 of the connector 3.

Second Molded Resin 5B

As shown in FIGS. 1 and 2, the second molded resin 5B is arranged on the notch portions 211 of the circuit board 2, that is to say, in recessed portions 53 formed in the first molded resin 5A covering the notch portions 211 of the circuit board 2. The second molded resin 5B in the recessed portions 53 formed in the first molded resin 5A is welded to the ends of the first molded resin 5A while covering the outer circumferences 41 of the collars 4.

The second molded resin 5B is arranged over the entire recessed portions 53 formed in the first molded resin 5A while covering the outer circumferences 41 of the collars 4. Also, in the connector device 1, the entirety of the first molded resin 5A and the second molded resin 5B has the shape of a rectangular plate.

The second molded resin 5B is formed through molding such that the first molded resin 5A covering the circuit board 2 and the connector 3 is arranged in a mold die, the mold die is filled with a melted resin material for forming the second molded resin 5B, and the resin material is solidified. The molding method is the same as that for the first molded resin 5A.

The second molded resin 5B has a gate mark 52B that indicates that the second molded resin 5B is formed through molding. The gate mark 52B is formed at an end of the second molded resin 5B. Also, in the second molded resin 5B, the molding method and the gate mark 52B are the same as those for the first molded resin 5A. Also, the thickness of the entire second molded resin 5B is substantially equal to the thickness of the entire first molded resin 5A including the circuit board 2.

Collar 4

As shown in FIGS. 1 and 2, the collars 4 are respectively arranged in the four notch portions 211 formed in the circuit board 2, that is to say, in the four recessed portions 53 formed in the first molded resin 5A that covers the notch portions 211. The collars 4 and the second molded resin 5B constitute the attaching portion 11 for attaching the connector device 1 to an external machine part 61 or the like. Each collar 4 is cylindrical, and has a central hole through which a bolt 42 is inserted. The two end portions of the collar 4 protrude from the surfaces of the second molded resin 5B. The bolt 42 inserted into the collar 4 is screwed into a screw hole formed in the machine part 61 or the like.

The collar 4 may have, on its outer circumference 41, a flange portion that protrudes toward the outer circumference to prevent the collar 4 from disengaging from the second molded resin 5B. Flange portions may also be formed at a plurality of positions in the axial direction of the collar 4.

Resin Materials for First Molded Resin 5A and Second Molded Resin 5B

The first molded resin 5A and the second molded resin 5B of the present embodiment are made of the same type of polyamide resins having different melting points or softening points. The first molded resin 5A is made of a polyamide resin whose melting point or softening point is 190° C., and the second molded resin 5B is made of a polyamide resin whose melting point or softening point is 230° C. The melting point or softening point of the polyamide resin of which the second molded resin 5B is made is higher than that of the polyamide resin of which the first molded resin 5A is made by 30° C. or more.

Here, "melting point" refers to a transition temperature at which a solid material transitions to liquid by being heated. "Softening point" refers to a temperature at which resin is softened, and that is defined according to the ring-and-ball method in compliance with JIS K6863. When the first molded resin 5A is formed, a polyamide resin material for the first molded resin 5A is heated to a temperature in a range from 190° C. to 230° C. inclusive, and the mold die is filled with the heated resin material. Also, the polyamide resin material that has filled up the mold die is cooled and solidified, so that the first molded resin 5A is formed.

The first molded resin 5A and the second molded resin 5B are made of the same type of resin materials, that is, the same type of polyamide resins. Accordingly, the strength of welding between the first molded resin 5A and the second molded resin 5B can further be increased. Furthermore, the melting point or softening point of the resin material for the first molded resin 5A is lower than that of the resin material for the second molded resin 5B. Therefore, when the second molded resin 5B is formed, the end portions of the first molded resin 5A are melted again, and the second molded resin 5B can be welded to the ends of the first molded resin 5A.

Method for Manufacturing Connector Device 1

Figure 8:
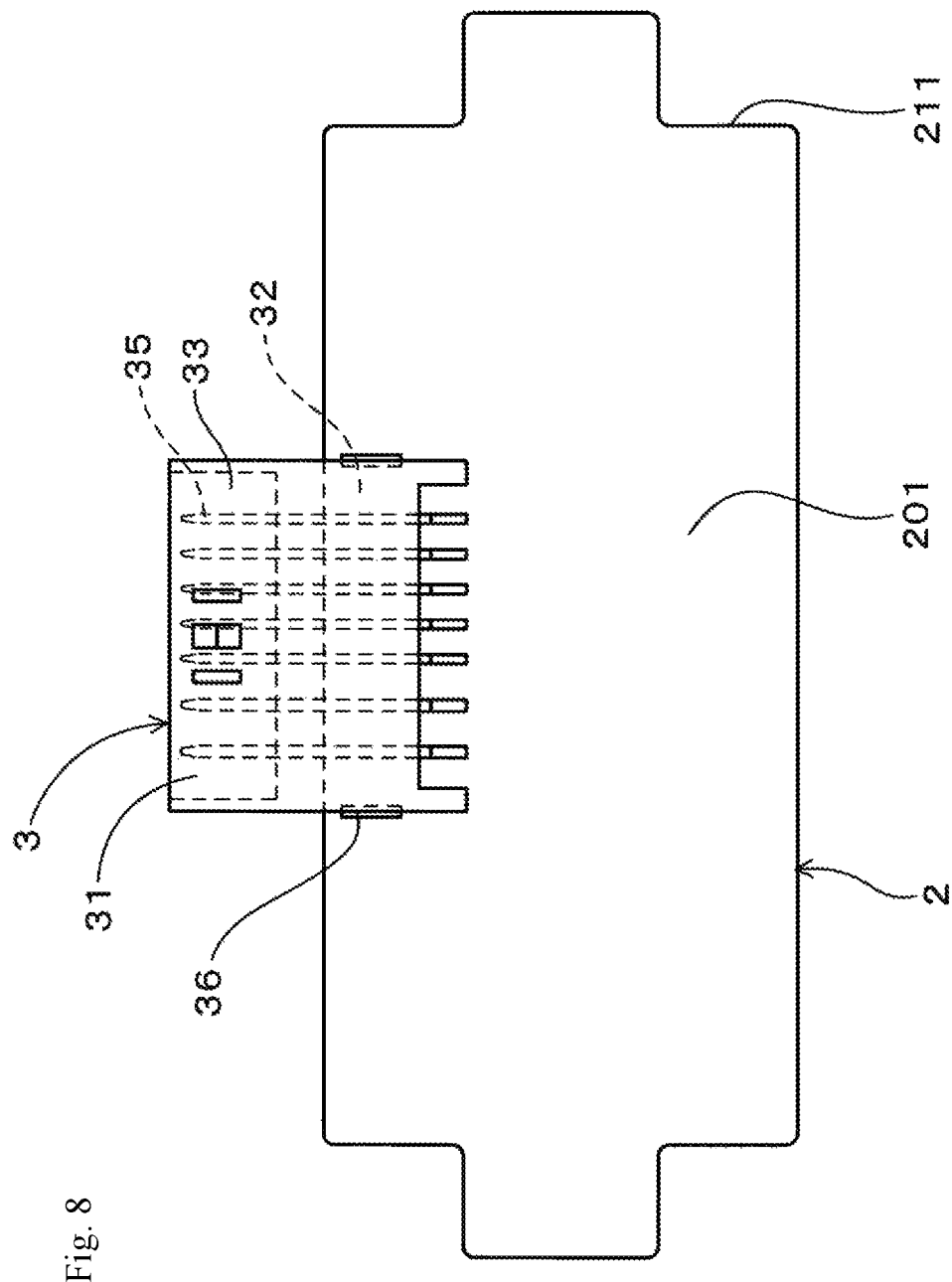
FIG. 8 is a plan view illustrating a circuit board to which a connector is attached, according to the embodiment.

When the connector device 1 is manufactured, first, insert molding, serving as injection molding, is performed for the housing 31 in which the plurality of terminals 35 and the plurality of pegs 36 are inserted, thereby forming the connector 3. Furthermore, the circuit board 2 on which various electric components 22 are arranged is formed. Then, as shown in FIG. 8, the connector 3 is arranged on the circuit board 2, and the plurality of terminals 35 and the plurality of pegs 36 of the connector 3 are connected, through soldering, to the conductor of the substrate portion 21. FIG. 8 shows the circuit board 2 on which the connector 3 is arranged, that is, FIG. 8 shows the connector device 1 before the molded resins 5A and 5B are provided.

Figure 9:
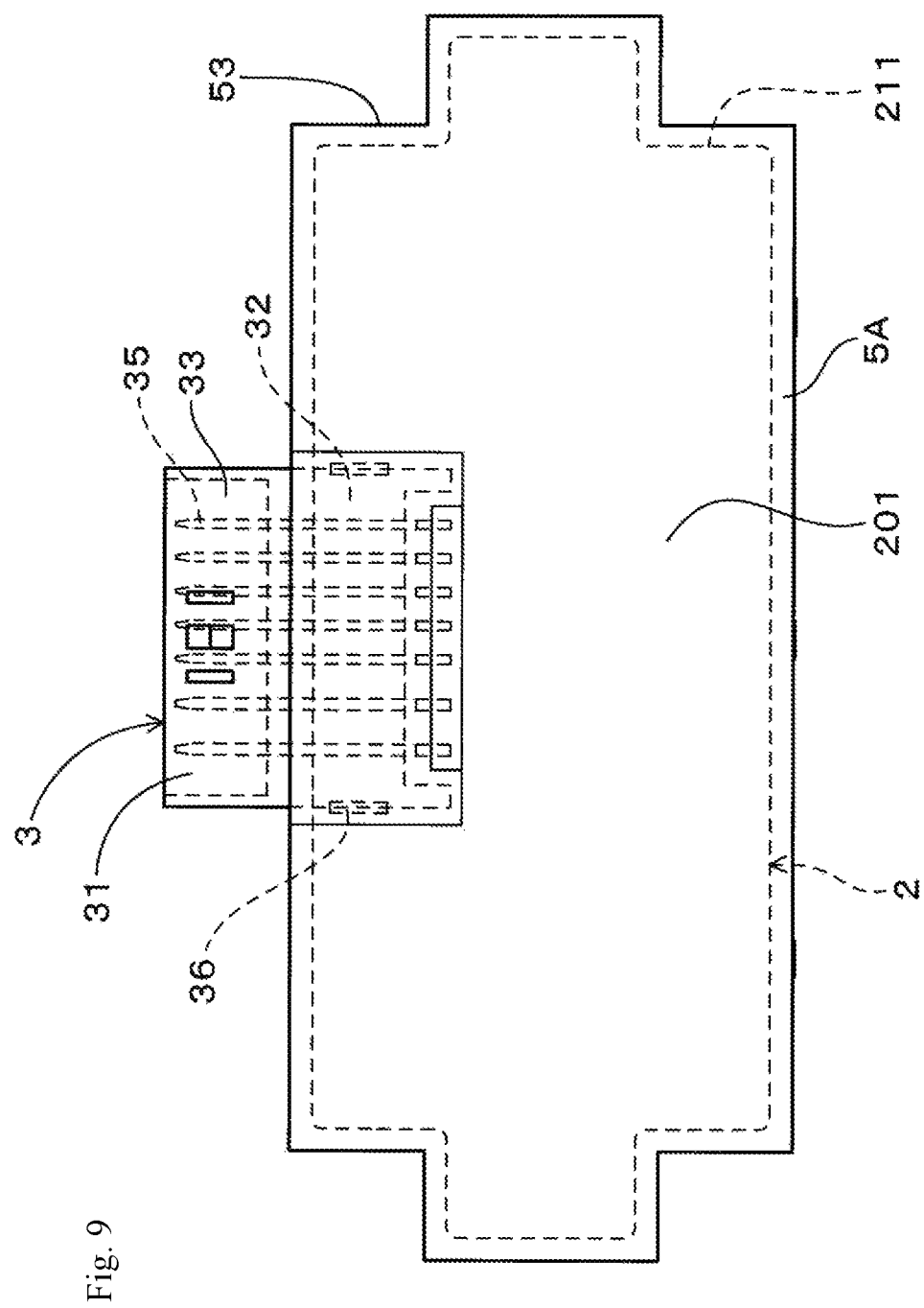
FIG. 9 is a plan view illustrating the connector and the circuit board on which a first molded resin is provided, according to the embodiment.

Then, as shown in FIG. 9, insert molding, namely, hot melt molding is performed for the first molded resin 5A in which the circuit board 2 on which the connector 3 is mounted are inserted. Accordingly, an intermediary body of the connector device 1 is formed, and the entire circuit board 2 and the holding portion 32 of the connector 3 are covered with the first molded resin 5A. Then, as shown in FIG. 1, insert molding, namely, hot melt molding is performed for the second molded resin 5B in which the intermediary body and the plurality of collars 4 are inserted. With this measure, the connector device 1 is manufactured, and the second molded resin 5B in which the collars 4 are arranged is welded at ends of the first molded resin 5A.

When the melted second molded resin 5B comes into contact with the ends of the first molded resin 5A, the ends of the first molded resin 5A are melted again, and are welded to the melted second molded resin 5B. Furthermore, as a result of the first molded resin 5A and the second molded resin 5B being made of the same type of resin material, it is possible to achieve strong welding therebetween.

In the manufactured connector device 1, the entire circuit board 2, the holding portion 32 of the housing 31 of the connector 3, the base portions 352 of the plurality of terminals 35, and the plurality of pegs 36 are embedded in the first molded resin 5A. Furthermore, the soldered portions between the base portions 352 of the plurality of terminals 35 and the plurality of pegs 36, and the conductor of the circuit board 2 are also embedded in the first molded resin 5A. Furthermore, the outer circumferences 41 of the plurality of collars 4 are embedded in the second molded resin 5B.

Furthermore, the hood portion 33 of the housing 31 and the leading end portions 351 of the plurality of terminals 35 are exposed to the outside of the first molded resin 5A. Furthermore, the polyamide resin of which the first molded resin 5A is made comes into areal contact with the liquid crystal polymer of which the housing 31 of the connector 3 is made, so that the interface K between the first molded resin 5A and the housing 31 is sealed.

Functional Effects

The connector device 1 of the present embodiment is of a molded type in which the entire circuit board 2 and part of the connector 3 are covered with the first molded resin 5A. Also, in this connector device 1, the outer circumferences 41 of the metal collars 4 are covered with the second molded resin 5B, which is made of a resin material having a higher melting point or softening point than that of the resin material of the first molded resin 5A.

The first molded resin 5A covers the entire circuit board 2, so that the entire circuit board 2 is protected from water by the first molded resin 5A. The first molded resin 5A also covers the holding portion 32 of the connector 3, and the hood portion 33 of the connector 3 to which the counterpart connector 62 is to be mounted is not covered with the first molded resin 5A.

The first molded resin 5A and the second molded resin 5B are formed through molding, namely, hot melt molding. The first molded resin 5A is made of a polyamide resin whose melting point or softening point is 200° C. or less, in order to protect a conductive material such as solder. On the other hand, the regions of the attaching portion 11 for attaching the connector device 1 to an external device that holds the collars 4 are regions that preferably have high rigidity to increase the strength of attachment.

In the connector device 1 of the present embodiment, only the regions that require rigidity are made of the second molded resin 5B, which has higher rigidity than the first molded resin 5A. In order to have rigidity, the second molded resin 5B is made of a crystalline resin material whose melting point or softening point is higher than that of a crystalline resin material of which the first molded resin 5A is made.

Crystalline resin materials have a correlation with each other such that the higher the melting point, the thicker a crystalline layer can be. By increasing the melting point of the resin material for the second molded resin 5B relative to the melting point of the resin material for the first molded resin 5A, the thickness of a crystalline layer of the second molded resin 5B is increased, so that the rigidity of the second molded resin 5B is increased relative to the rigidity of the first molded resin 5A.

Furthermore, in the connector device 1 of the present embodiment, the resin material of which the first molded resin 5A is made, and the resin material of which the second molded resin 5B is made are made of the same type of resin material such as a polyamide resin. Accordingly, even when formation of the first molded resin 5A and formation of the second molded resin 5B are performed separately one by one, it is possible to weld the molded resins 5A and 5B together rigidly.

Also, the collars 4 are integrated with the second molded resin 5B, so that the rigidity in the vicinity of the collars 4 can be increased. Accordingly, the connector device 1 can be made less likely to vibrate, when the connector device 1 is attached to the external machine part 61 or the like using the bolts 42 inserted through the collars 4.

According to the connector device 1 of the present embodiment, it is possible to improve the strength of a molded-type connector device 1 when it is attached to an external device.

Furthermore, the interface K between the housing 31 of the connector 3 and the first molded resin 5A is located on the surface of the connector device 1, and this interface K is a region of the connector device 1 that needs a countermeasure against water the most. In the connector device 1 of the present embodiment, a polyamide resin whose melting point or softening point is 230° C. or less is used for the first molded resin 5A, and a liquid crystal polymer or a poly phenylene sulfide resin is used for the housing 31 of the connector 3.

The combination of the polyamide resin and the liquid crystal polymer or the poly phenylene sulfide resin can improve the waterproofing performance between the housing 31 of the connector 3 and the first molded resin 5A. Also, it is possible to prevent water from entering the first molded resin 5A from the boundary between the housing 31 of the connector 3 and the first molded resin 5A.

Through the research and development by the inventors of the present application, it turned out that the areal contact between a polyamide resin and a liquid crystal polymer or a poly phenylene sulfide resin is especially superior. It was found for the first time through the research and development by the inventors of the present application that the combination of these resin materials increases the waterproofing performance (sealing properties and water stopping properties) at the interface K between the materials.

The reason why the waterproofing performance at the interface K is improved may be because an amide bond in the polyamide resin binds to a polar group in the liquid crystal polymer or a polar group in the poly phenylene sulfide resin, which increases the degree of areal contact between the housing 31 of the connector 3 and the first molded resin 5A.

Thus, according to the connector device 1 of the present embodiment, it is possible to improve the waterproofing performance between the housing 31 of the connector 3 and the first molded resin 5A.

Other Configurations of First Molded Resin 5A and Second Molded Resin 5B

The first molded resin 5A may be made of a polyester resin, and the second molded resin 5B may be made of a polyester resin whose melting point or softening point is higher than that of the polyester resin of which the first molded resin 5A is made. Also in this case, the strength of welding between the first molded resin 5A and the second molded resin 5B can further be improved.

Moreover, the second molded resin 5B may also be made of a resin material that contains glass fibers. Glass fibers may be contained in the polyamide resin or polyester resin of which the second molded resin 5B is made. In this case, it is possible to easily increase the rigidity of the second molded resin 5B relative to the rigidity of the first molded resin 5A.

The present disclosure is not limited only to the embodiment, and other embodiments may also be configured without departing from the spirit thereof. Furthermore, the present disclosure encompasses various modifications, modifications within the equivalent scope, and the like. Furthermore, the technical idea of the present disclosure includes various combinations of the constituent components envisaged from the present disclosure, aspects, and the like.

What is claimed is:

1. A connector device comprising:
    a circuit board;
    a connector attached to the circuit board;
    a plurality of collars for external attachment;
    a first molded resin that is made of a first resin material whose melting point or softening point is 230° C. or less, and covers the entire circuit board and part of the connector; and
    a second molded resin that is welded to the first molded resin, is made of a second resin material whose melting point or softening point is higher than that of the first resin material for the first molded resin, and covers outer circumferences of the collars,
    wherein the first molded resin is made of a first polyester resin, and the second molded resin is made of a second polyester resin whose melting point or softening point is higher than that of the first polyester resin of which the first molded resin is made.

2. The connector device according to claim 1, wherein:
    the collars are respectively arranged in notches formed in the circuit board,
    an end of the first molded resin is arranged along an edge face of the circuit board that includes edge faces of the notches, and
    the second molded resin is arranged in the notches, and is welded to an end of the first molded resin while covering the outer circumferences of the collars.

3. The connector device according to claim 2, wherein:
    the circuit board has a shape such that the notches are located at four corners of a rectangular plate, and
    the rectangular plate is constituted by an entirety of the first molded resin and the second molded resin.

4. The connector device according to claim 1, wherein the first molded resin is made of a first polyamide resin, and the second molded resin is made of a second polyamide resin whose melting point or softening point is higher than that of the first polyamide resin of which the first molded resin is made.

5. The connector device according to claim 1, wherein the second molded resin is made of the second resin material that contains glass fibers.

6. The connector device according to claim 1, wherein the first molded resin and the second molded resin have gate marks that respectively indicate that the first molded resin and the second molded resin are formed through molding.

7. The connector device according to claim 1, wherein a region of the first molded resin that faces a plate of the circuit board has a thickness in a range from 1 mm to 5 mm inclusive.

8. The connector device according to claim 1, wherein the connector device is used as an on-board control unit.

* * * * *